(12) United States Patent  
Nakayama

(10) Patent No.: US 9,368,639 B2  
(45) Date of Patent: Jun. 14, 2016

(54) OXIDE SEMICONDUCTOR THIN FILM, PRODUCTION METHOD THEREOF, AND THIN FILM TRANSISTOR

(71) Applicant: SUMITOMO METAL MINING CO., LTD., Tokyo (JP)

(72) Inventor: Tokuyuki Nakayama, Tokyo (JP)

(73) Assignee: SUMITOMO METAL MINING CO., LTD., Tokyo (JP)

(*) Notice: Subject to any disclaimer, the term of this patent is extended or adjusted under 35 U.S.C. 154(b) by 0 days.

(21) Appl. No.: 14/646,869

(22) PCT Filed: Nov. 21, 2013

(86) PCT No.: PCT/JP2013/081445  
§ 371 (c)(1),  
(2) Date: May 22, 2015

(87) PCT Pub. No.: WO2014/080996  
PCT Pub. Date: May 30, 2014

(65) Prior Publication Data  
US 2015/0287830 A1  Oct. 8, 2015

(30) Foreign Application Priority Data

Nov. 22, 2012  (JP) ................. 2012-256866

(51) Int. Cl.  
*H01L 29/00* (2006.01)  
*H01L 29/786* (2006.01)  
(Continued)

(52) U.S. Cl.  
CPC ............ *H01L 29/7869* (2013.01); *C23C 14/08* (2013.01); *C23C 14/3414* (2013.01);  
(Continued)

(58) Field of Classification Search  
CPC .................. H01L 21/02565; H01L 29/78693; H01L 29/66742; H01L 21/02592; H01L 29/786  
See application file for complete search history.

(56) References Cited

U.S. PATENT DOCUMENTS

| 8,330,157 B2 | 12/2012 | Fujii et al. |
| 2010/0025680 A1 | 2/2010 | Shino et al. |

(Continued)

FOREIGN PATENT DOCUMENTS

| JP | 2008-192721 A | 8/2008 |
| JP | 2010-045263 A | 2/2010 |

(Continued)

OTHER PUBLICATIONS

Notice of Allowance dated Nov. 20, 2015, from U.S. Appl. No. 14/434,939.

(Continued)

*Primary Examiner* — Ngan Ngo  
(74) *Attorney, Agent, or Firm* — Katten Muchin Rosenman LLP

(57) ABSTRACT

An oxide crystalline thin film is used to provide an oxide semiconductor thin film that has comparatively high carrier mobility and is suitable as TFT channel layer material. Oxide semiconductor thin film is obtained by performing an annealing process on an amorphous oxide semiconductor thin film comprising an oxide including indium and titanium where the titanium content is 0.005 to 0.12 by a Ti/In atomic ratio at a heating temperature of 250° C. or greater and processing time of 1 minute to 120 minutes. The oxide semiconductor thin film is crystalline and comprises only the $In_2O_3$ phase of bixbyite type structure, and has carrier density that is $1\times10^{19}$ $cm^{-3}$, and carrier mobility that is 1 $cm^2$/Vsec or greater.

9 Claims, 2 Drawing Sheets

(51) Int. Cl.
*H01L 21/02* (2006.01)
*H01L 29/66* (2006.01)
*C23C 14/08* (2006.01)
*H01L 29/24* (2006.01)
*C23C 14/34* (2006.01)
*C23C 14/58* (2006.01)
*H01L 29/04* (2006.01)

(52) U.S. Cl.
CPC ...... *C23C14/5806* (2013.01); *H01L 21/02422* (2013.01); *H01L 21/02425* (2013.01); *H01L 21/02488* (2013.01); *H01L 21/02565* (2013.01); *H01L 21/02592* (2013.01); *H01L 21/02631* (2013.01); *H01L 29/04* (2013.01); *H01L 29/24* (2013.01); *H01L 29/66742* (2013.01); *H01L 29/786* (2013.01); *H01L 29/78693* (2013.01)

(56) References Cited

U.S. PATENT DOCUMENTS

| | | | |
|---|---|---|---|
| 2010/0140609 A1 | 6/2010 | Yano et al. | |
| 2010/0276688 A1* | 11/2010 | Yano | H01L 29/7869 257/43 |
| 2011/0168994 A1 | 7/2011 | Kawashima et al. | |
| 2011/0180763 A1* | 7/2011 | Utsuno | C04B 35/01 252/512 |
| 2011/0198586 A1 | 8/2011 | Inoue et al. | |
| 2012/0037897 A1 | 2/2012 | Shiino et al. | |
| 2012/0168748 A1 | 7/2012 | Yano et al. | |
| 2012/0292617 A1 | 11/2012 | Ebata et al. | |
| 2015/0235820 A1* | 8/2015 | Nakayama | H01J 37/3429 204/298.13 |

FOREIGN PATENT DOCUMENTS

| | | |
|---|---|---|
| JP | 2010-106291 A | 5/2010 |
| JP | 2010-182924 A | 8/2010 |
| JP | 2010-219538 A | 9/2010 |
| JP | 2010-251604 A | 11/2010 |
| JP | 2010-251606 A | 11/2010 |
| JP | 2011-146571 A | 7/2011 |
| WO | 2008/117739 A1 | 10/2008 |
| WO | 2009/148154 A1 | 12/2009 |
| WO | 2010/047077 A1 | 4/2010 |

OTHER PUBLICATIONS

International Search Report and Written Opinion dated Jan. 7, 2014, from the corresponding PCT/JP2013/081445.
International Search Report and Written Opinion dated Jan. 14, 2014, from PCT/JP2013/077610.

* cited by examiner

OXIDE SEMICONDUCTOR THIN FILM, PRODUCTION METHOD THEREOF, AND THIN FILM TRANSISTOR

TECHNICAL FIELD

The present invention relates to an oxide semiconductor thin film, a production method thereof and a thin film transistor that uses the oxide semiconductor thin film.

BACKGROUND ART

A thin film transistor (TFT) is a kind of field effect transistor (FET). The basic structure of a TFT is a three-terminal element that comprises a gate terminal, a source terminal and a drain terminal, and is an active element that uses a semiconductor thin film that is formed on a substrate as a channel layer in which electrons or holes move, and has a function of switching the current between the source terminal and drain terminal by applying voltage to the gate terminal and controlling the current that flows in the channel layer.

Currently, polycrystalline silicon film or amorphous silicon film is used as the channel layer of a TFT. Particularly, amorphous silicon film can be formed as a uniform film on a large area tenth-generation glass substrate, so is widely used as a channel layer of a TFT for liquid crystal panels. However, the amorphous silicon film has low mobility of electron carriers (carrier mobility) of 1 $cm^2/Vsec$ or less, so its application in TFT for high-definition panels is becoming more difficult. In other words, as the definition of liquid crystals increases, there is a need to use semiconductor thin film that has higher carrier mobility than that of 1 $cm^2/Vsec$ of the amorphous silicon film for the channel layer.

On the other hand, polycrystalline silicon film has high carrier mobility of about 100 $cm^2/Vsec$, so has sufficient characteristics as channel layer material for a TFT for a high-definition panel. However, in polycrystalline film, the carrier mobility at the crystal boundary is reduced, so there are problems in that the uniformity in the surface of the substrate is poor, and there is variation in the TFT characteristics. Moreover, in the production process for a polycrystalline film, after an amorphous silicon film is formed at a relatively low temperature of 300° C. or less, the film is crystallized by an annealing process. This annealing process is a special process that employs excimer laser annealing or the like, so a high running cost is necessary. In addition, the size of the glass substrate that can be used is limited to the fifth-generation level, so the cost reduction of the polycrystalline film is limited, and thus the product development is also limited.

Due to this, currently, development is actively being performed to obtain a channel layer material that comprises the best characteristics of both amorphous silicon film and polycrystalline silicon film, and that is also low cost. For example, JP 2010-219538 (A) discloses a transparent semi-insulating amorphous thin film that is a transparent amorphous oxide thin film (a-IGZO film) that is formed by a vapor phase film deposition method, and comprises the elements of indium (In), gallium (Ga), zinc (Zn) and oxygen (O), where the structure after crystallization is $InGaO_3(ZnO)_m$ (m is a natural number less than 6), has a carrier mobility greater than 1 $cm^2/Vsec$, and a carrier density of $10^{16}/cm^3$ or less without adding impurity ions, and discloses a thin film transistor that uses this transparent semi-insulating amorphous thin film as a channel layer.

However, even though the a-IGZO film that is disclosed in JP 2010-219538 (A) and formed by a vapor phase film deposition method such as a sputtering method or pulse laser vapor deposition method has relatively high carrier mobility in the range of 1 $cm^2/Vsec$ to 10 $cm^2/Vsec$, the amorphous oxide thin film is such that oxide deficiencies inherently occur easily, and the behavior of the electrons as carriers is not always stable with respect to external factors such as heat, so there is a problem in that the operation of a device such as a TFT becomes unstable. Furthermore, it has been pointed out that when a negative bias is continuously applied to a TFT element under visible-light irradiation, a phenomenon, which is unique to amorphous film, occurs in that the threshold voltage shifts to the negative side (illumination negative bias degradation phenomenon), and this phenomenon becomes a serious problem in uses such as liquid-crystal displays.

In regard to this, JP 2008-192721 (A) discloses applying an indium oxide film that is doped with tin (Sn), titanium (Ti) or tungsten (W), or an indium oxide film that is doped with tungsten and zinc and/or tin for the channel layer with the object of obtaining a thin film transistor in which elements can be made on a polymeric substrate without requiring a high-temperature process, and that is capable of achieving high performance and high reliability at low cost. According to JP 2008-192721 (A), by applying the amorphous oxide thin film that is obtained with this technology to the channel layer, the TFT element is able to achieve carrier mobility of 5 $cm^2/Vsec$ or more.

Moreover, JP 2010-251604 (A) similarly discloses technology in which an indium oxide thin film is formed using an indium oxide sintered compact that is doped with one or two or more of the elements of tin, titanium, tungsten and zinc as a target by a non-heating sputtering film formation method, after which heat treatment is performed for 10 minutes to 120 minutes at 150° C. to 300° C. With this technology, it is possible to obtain a stable indium oxide film with relatively easy control, while at the same time maintain both the characteristics of having high mobility and being amorphous; and by using this indium oxide film as a channel layer, it is possible to obtain a stable TFT element.

However, the indium oxide films that are obtained by the technology disclosed in the literatures above are amorphous films, so problems such as the easy occurrence of oxygen deficiencies, and the films being unstable with respect to external factors such as heat, and furthermore, the problem of the occurrence of an illumination negative bias degradation phenomenon, which is unique to amorphous film, basically cannot be solved. Moreover, when taking into consideration the use of the films as channel layer material for a TFT of a high-definition panel, achieving even higher carrier mobility is desired.

RELATED LITERATURE

Patent Literature

[Patent Literature 1] JP 2010-182924 (A)
[Patent Literature 2] JP 2008-192721 (A)
[Patent Literature 3] JP 2010-251606 (A)

SUMMARY OF INVENTION

Problem to be Solved by Invention

The object of the present invention is to provide an oxide semiconductor thin film using an oxide crystalline thin film that, in order to eliminate the problems of an oxide amorphous thin film as an oxide semiconductor thin film, comprises relatively high carrier mobility, and is suitable as channel layer material of a thin film transistor (TFT).

Means for Solving Problems

The inventors diligently investigated substitute materials for an oxide amorphous thin film that could be applied to an oxide semiconductor thin film. More specifically, experiments were performed by forming crystalline oxide semiconductor thin films by annealing an oxide of indium and titanium that were obtained by a sputtering method. When doing this, conditions for the crystallized oxide semiconductor thin film to achieve high carrier mobility, or in other words, conditions for the composition, film thickness and crystallization of the oxide of indium and titanium as oxide semiconductor thin film were investigated in detail.

As a result, it was learned that by regulating within a specified range the amount of titanium included in an oxide semiconductor thin film having and oxide of indium and titanium as main components, and performing an annealing process on this kind of amorphous thin film under specified conditions to obtain a crystalline oxide semiconductor thin film comprising only the $In_2O_3$ phase of bixbyite type structure, it is possible to obtain an oxide semiconductor thin film that has high carrier mobility of 1 $cm^2$/Vsec or greater and low carrier density of $1\times10^{19}$ $cm^{-3}$ or less, and that is suitable as the channel layer material of a thin-film transistor (TFT). The present invention was invented based on this knowledge.

In other words, the oxide semiconductor thin film of the present invention comprises an oxide that includes indium and titanium, wherein the titanium content is 0.005 to 0.12 by a Ti/In atomic ratio; the oxide semiconductor thin film is crystalline and comprises only the $In_2O_3$ phase of bixbyite type structure; and the carrier density is $1\times10^{19}$ $cm^{-3}$, and the carrier mobility is 1 $cm^2$/Vsec or greater.

The oxide semiconductor thin film of the present invention with such properties can be produced by a process in which an annealing process is performed on an amorphous oxide semiconductor thin film comprising an oxide that contains indium and titanium where the titanium content is 0.005 to 0.12 by a Ti/In atomic ratio at a heating temperature of 250° C. or greater and processing time of 1 minute to 120 minutes, to obtain an oxide semiconductor thin film that is crystalline and comprising only the $In_2O_3$ phase of bixbyite type structure, and having carrier density of $1\times10^{19}$ $cm^{-3}$ or less and carrier mobility of 1 $cm^2$/Vsec or greater.

Preferably, the titanium content is 0.01 to 0.06 by the Ti/In atomic ratio.

Preferably, the carrier mobility is 3 $cm^2$/Vsec or greater, and more preferably the carrier density is $5\times10^{17}$ $cm^{-3}$ or less, and the carrier mobility is 5 $cm^2$/Vsec or greater.

Preferably, film thickness of the oxide semiconductor thin film is 15 nm to 200 nm, and more preferably, is 40 nm to 100 nm.

Preferably, the crystal grain size of the $In_2O_3$ phase is 10 nm or greater.

Moreover, the thin-film transistor of the present invention comprises a source electrode, a drain electrode, a gate electrode, a channel layer and a gate insulating layer, wherein the channel layer comprises the oxide semiconductor thin film of the present invention.

Effect of Invention

The oxide semiconductor thin film of the present invention is an oxide crystalline thin film, so has high carrier mobility exceeding 1 $cm^2$/Vsec, is such that oxygen deficiencies do not easily occur, is stable against external factors such as heat, and there is no problem such as the occurrence of the illumination negative bias degradation phenomenon.

Moreover, the oxide semiconductor thin film of the present invention can be obtained by performing an annealing process on an oxide amorphous thin film having specified composition at a temperature of 400° C. or less, for example, to obtain an oxide crystalline thin film comprising only the $In_2O_3$ phase of bixbyite type structure and having high crystallinity.

Therefore, by using the oxide semiconductor thin film of the present invention as channel layer material, it is possible to improve the TFT characteristics at low cost, so the present invention has very large industrial significance.

MODES FOR CARRYING OUT INVENTION

Figure 1:
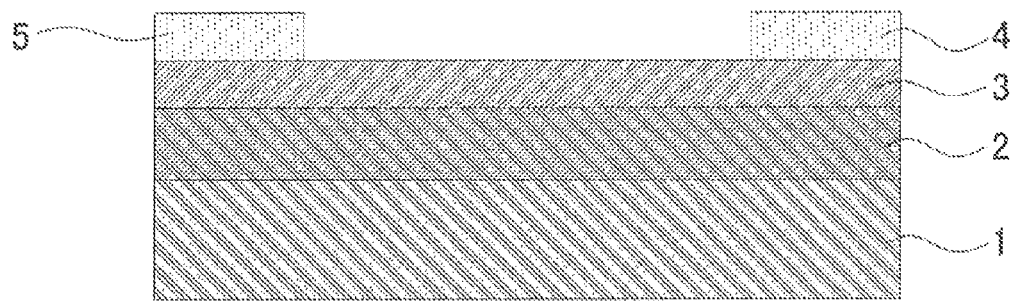
FIG. 1 is a cross-sectional view of a TFT element of the present invention.
Figure 2:
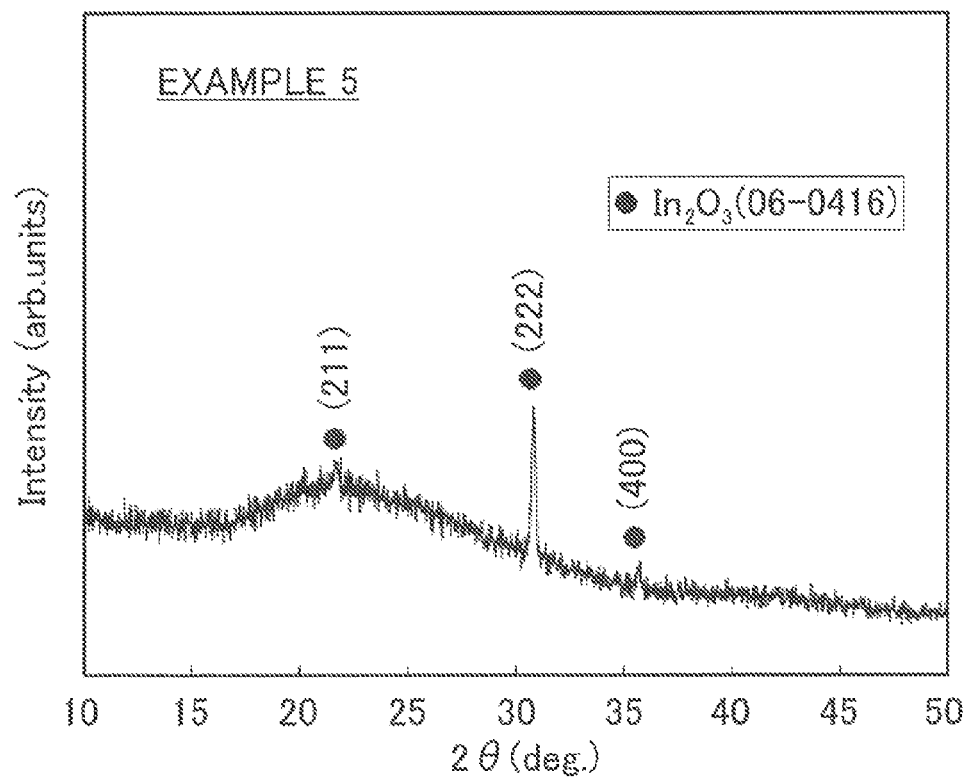
FIG. 2 is graph illustrating the results of performing X-ray diffraction measurement of an oxide semiconductor thin film of a fifth example.

In the following, an oxide semiconductor thin film of the present invention and a thin film transistor (TFT) that uses the oxide semiconductor as channel layer material will be explained in detail.

1. Oxide Semiconductor Thin Film (a) Composition

The crystalline oxide semiconductor thin film of the present invention that comprises an oxide that includes indium (In) and titanium (Ti) must be controlled so that the titanium content within the range of 0.005 to 0.12 by a Ti/In atomic ratio. As a result, it is possible to achieve good carrier characteristics such as a carrier density of $1\times10^{19}$ $cm^{-3}$ or less, carrier mobility of 1 $cm^2$/Vsec or greater, or further 3 $cm^2$/Vsec or greater.

The carrier sources of a crystalline oxide semiconductor thin film that comprises only indium and does not include any other added elements are mainly oxygen deficiencies, however, by adding titanium having a high oxidation affinity, generation of oxygen deficiencies can be suppressed. On the other hand, titanium inside a crystalline oxide semiconductor thin film becomes tetravalent ions, which behaves as a donor and is capable of becoming a carrier source. Moreover, the titanium behaves as an impurity ion scattering center and becomes the cause of carrier scattering, so causes the carrier mobility to decrease. Therefore, in the case of a crystalline oxide semiconductor thin film that comprises an oxide of indium and titanium, it is necessary to control the titanium content within the above range so that suppression of the generation of oxygen deficiencies becomes predominant without increasing the carrier density as a carrier source more than necessary, and so that ion scattering does not become excessive.

When the titanium content is less than 0.005 by the Ti/In atomic ratio, it is not possible to sufficiently obtain the effect of suppressing the generation of carrier sources by the oxygen affinity of titanium. On the other hand, when the titanium content is greater than 0.12 by the Ti/In atomic ratio, not only does the action of titanium as a carrier source become predominant, but scattering of carriers becomes severe, and the carrier mobility becomes 1 cm$^2$/Vsec or less. Therefore, in either case, the carrier density of the oxide semiconductor thin film becomes greater than $1 \times 10^{19}$ cm$^{-3}$.

Preferably, as a TFT channel layer, there is an even lower carrier density and higher carrier mobility, however, in the case of the oxide semiconductor thin film of the present invention, by controlling the titanium content to be within the range of 0.01 to 0.06 by the Ti/In atomic ratio, it is possible to simultaneously achieve a carrier density of $5 \times 10^{17}$ cm$^{-3}$ or less, and carrier mobility of 5 cm$^2$/Vsec or greater.

The oxide semiconductor thin film of the present invention is constructed by the oxide of indium and titanium except for inevitable impurities, however, it can be constructed by an oxide containing indium and titanium as main components and also optionally including additional elements other than inevitable impurities. Examples of such additional element are, for example, gallium (Ga), aluminum (Al), Chromium (Cr), iron (Fe), tantalum (Ta), and the like. The content of these additional elements is such that when the number of atoms of the additional elements is taken to be M, the M/In atomic ratio is preferably 0.0025 or less, and more preferably 0.001 or less. When the content of additional elements is greater than 0.0025 by the M/In atomic ratio, it is not possible to obtain the desired characteristics due to the relationship with the content of indium and titanium.

(b) Crystal Structure

The oxide semiconductor thin film of the present invention is crystalline and practically comprises only the indium oxide In$_2$O$_3$ phase of bixbyite type structure, and practically does not include crystal phases other than this structure. In the In$_2$O$_3$ phase of bixbyite type structure, InO$_6$ octahedron structure that comprises indium and oxygen is formed, where adjacent InO$_6$ octahedron structures share an edge, and the In—In distance is short. Therefore, the overlapping of orbits of electrons which function as carriers becomes large, and carrier mobility improves. The elements other than indium such as titanium and an additional element dissolve in the In$_2$O$_3$ phase of this bixbyite type structure.

Here, the fact that practically no crystal phases other than the In$_2$O$_3$ phase of the bixbyite type structure are included means that, in addition to the phase that comprises only the In$_2$O$_3$ phase of the bixbyite type structure, a small amount of phases other than the In$_2$O$_3$ phase that share an edge with the InO$_6$ octahedron structure are also included in the oxide semiconductor thin film of the present invention as long as the characteristics of the oxide semiconductor thin film (carrier density and carrier mobility) are within the range of the present invention.

(c) Average Crystal Grain Size

In the oxide semiconductor thin film of the present invention, the size of the crystal grains of the oxide semiconductor thin film, or in other words, the average crystal grain size is preferably 10 nm or greater, and more preferably 20 nm, and even more preferably 50 nm or greater. By making an oxide semiconductor thin film having an average crystal grain size of 10 nm or greater, scattering of carriers at the crystal grain boundary decreases, so it becomes possible to stably improve the carrier mobility to 1 cm$^2$/Vsec or greater. The upper limit value for the average crystal grain size is not particularly limited, however, from the aspect of providing a uniform distribution of crystal grain boundaries that exist in the channel layer, preferably the upper limit is 1000 nm or less. The average crystal grain size can be found, for example, from calculation from X-ray diffraction measurement results, or image analysis of SEM or EBSD observation images.

(d) Film Thickness

The film thickness of the oxide semiconductor thin film of the present invention is preferably controlled to be within the range of 15 to 200 nm, and more preferably 30 to 150 nm, and even more preferably 40 to 100 nm.

Generally, the semiconductor thin film including but not limited to an oxide is often formed on a glass substrate. In other words, a crystalline substrate is formed on an amorphous substrate. Therefore, in the case of the oxide semiconductor thin film of the present invention, when the film thickness is less than 15 nm, it depends on the titanium content, however, even when an annealing process is performed at a high temperature of 400° C. due to the effect of the substrate, there are cases in which the oxide amorphous thin film precursor is not crystallized. There are also cases in which even though this oxide amorphous thin film is crystallized, sufficient crystallinity is not obtained, or it may become difficult to make the average crystal grain size of the obtained crystal film 10 nm or more. Therefore, it is not possible to stably obtain high carrier mobility in the obtained oxide semiconductor thin film.

The effect on the crystallinity of the oxide semiconductor thin film due to the substrate being amorphous can be reduced by making the film thickness of the oxide semiconductor thin film 30 nm or greater; however, by making the thickness 40 nm or greater, it becomes possible to stably eliminate that effect. However, when taking cost into consideration, preferably the film thickness is 200 nm or less, and more preferably 150 nm or less, and even more preferably 100 nm or less. By controlling the film thickness to around 100 nm, it is expected that transmission of blue light can be improved through optical interference when the oxide semiconductor thin film of the present invention is formed on a glass substrate. Therefore, when applied to a transparent TFT, preferably the film thickness is controlled to around 100 nm.

(e) Characteristics

The oxide semiconductor thin film of the present invention described above comprises oxides of indium and titanium, is crystalline and comprises only the In$_2$O$_3$ phase of bixbyite type structure. Therefore, a TFT in which the oxide semiconductor thin film of the present invention is applied is highly stable against external factors such as heat, and the occurrence of the illumination negative bias degradation phenomenon is difficult.

Moreover, in the oxide semiconductor thin film of the present invention, by controlling the titanium content in the oxide semiconductor to be within a specified range, the carrier density is regulated to $1 \times 10^{19}$ cm$^{-3}$ or less, and the carrier mobility is regulated to 1 cm$^2$/Vsec or greater. By regulating the carrier density and carrier mobility to be within such a range, it becomes possible to apply the oxide semiconductor thin film as channel layer material that requires a carrier density that is 2 to 4 digits lower than a transparent conductive film, and it becomes possible to ensure the pixel control performance of the TFT by the high carrier mobility.

When the carrier density is greater than $1 \times 10^{19}$ cm$^{-3}$, it becomes difficult to apply the oxide semiconductor thin film as TFT channel layer material. In order to achieve a TFT that has a high on/off ratio, it is necessary to regulate the carrier density of the channel layer to be preferably $1 \times 10^{18}$ cm$^{-3}$ or less, or more preferably $1 \times 10^{17}$ cm$^{-3}$ or less, however, the oxide semiconductor thin film of the present invention is able to achieve such a low carrier density. Here, the on/off ratio means the ratio of the resistance in the off state with respect to that in the on state, and can be measured by a semiconductor parameter analyzer.

On the other hand, when the carrier mobility is less than 1 $cm^2$/Vsec, it becomes difficult to ensure the high pixel control performance of a TFT. Particularly, when considering application to a TFT for a high-definition liquid-crystal panel, it is necessary to make the carrier mobility preferably 3 $cm^2$/Vsec or greater, and more preferably 5 $cm^2$/Vsec or greater, however, the oxide semiconductor thin film of the present invention is able to achieve high carrier mobility such as this.

2. Production Method for Oxide Semiconductor Thin Film (a) Film Formation (a-1) Raw Materials The oxide semiconductor thin film of the present invention is formed on a substrate by known film-formation technology such as a sputtering method, ion plating method and the like that uses an oxide sintered compact target or tablet. When doing this, the metal element composition ratio of the oxide sintered compact raw material can also be appropriately set according to the film formation conditions. However, taking the composition ratio of the metal elements of the oxide sintered compact to be the same as the composition ratio of the target oxide semiconductor thin film, and forming the film by performing control so that the composition ratio is maintained, can be said to be an easy procedure. Therefore, in the present invention, the composition ratio of the oxide sintered compact is preferably the same as the metal composition ratio of the target oxide semiconductor thin film. In other words, an oxide sintered compact comprising oxides that include indium and titanium, and having a titanium content that is 0.005 to 0.12 by a Ti/In atomic ratio, and more preferably 0.01 to 0.06, is used as the raw material of the oxide semiconductor thin film of the present invention.

As this kind of oxide sintered compact, an oxide sintered compact that mainly comprises the $In_2O_3$ phase of bixbyite type structure is used. Normally, titanium is dissolved in this $In_2O_3$ phase. However, an $In_2O_3$ phase in which titanium is not dissolved, or in other words, an $In_2O_3$ phase in which any elements except inevitable impurities are not dissolved may coexist. Moreover, a sintered oxide in which a crystal phase other than the $In_2O_3$ phase is dispersed in an indium oxide sintered compact in the form of titanium oxide such as TiO, $TiO_2$ and the like, or in the form of a compound oxide between an indium oxide and a titanium oxide such as $In_2Ti_3O_{12}$ can be also used as the raw material for the target or tablet.

However, the area ratio of crystal phases other than $In_2O_3$ with respect to the $In_2O_3$ phase must be a percentage of 10% or less. In a normal direct current (DC) sputtering method, the direct current power is increased in order to improve the speed of film formation. When doing this, when the area ratio is greater than 10%, it is possible that as sputtering advances, a crystal phase other than the $In_2O_3$ phase will become the starting point of nodule growth. On the other hand, in an oxide sintered compact that is used in film formation of the oxide semiconductor thin film of the present invention, the area ratio of crystal phases other than the $In_2O_3$ phase is controlled to be 10% or less, and the crystal phase other than the $In_2O_3$ phase is substantially dispersed finely, so the structure is such that the crystal phase other than the $In_2O_3$ phase does not easily become the starting point of nodule growth. By using this kind of oxide sintered compact as the material of the target or tablet, the occurrence of nodules is suppressed even when the direct current power that is applied during film formation is increased, and it becomes difficult for abnormal electric discharge to occur such as arcing, so it is possible to form an oxide semiconductor thin film efficiently.

(a-2) Film Formation Conditions

The oxide semiconductor thin film of the present invention can be formed by using a normal sputtering method or ion plating method, and in conditions that are normally applied in these methods. When the oxide semiconductor thin film of the present invention is formed on a substrate by a sputtering method, especially in the case of a direct-current sputtering method, the effect of heat during film formation is small, and film can be formed at high speed, so is industrially advantageous.

A glass substrate is representative of a substrate, however, any substrate that is for a semiconductor device such as silicon can also be used, and in addition to that, as long as it is possible to withstand the temperature of the process above, it is also possible to use a resin substrate or resin film as the substrate.

The substrate temperature is preferably equal to or less than the crystallization temperature of the amorphous film of an oxide including indium and titanium. If the amorphous film is crystallized during film formation, elimination of oxygen deficiencies in the annealing process after that does not proceed, and as a result, it may become difficult to control the carrier density so as to be $1\times10^{19}$ $cm^{-3}$ or less, or preferably $5\times10^{17}$ $cm^{-3}$. From this aspect, the substrate temperature is preferably 200° C. or less when the film thickness is in the range of 15 nm to 70 nm, and 100° C. when the film thickness is in the range of 70 nm to 200 nm. In either case, the temperature is preferably in the range of from room temperature to 100° C.

The other film formation conditions are not particularly limited, and must be appropriately selected according to the film formation method and film formation apparatus. For example, when the oxide semiconductor thin film of the present invention is formed using a direct-current sputtering method, the air inside of the chamber of the sputtering apparatus is evacuated to $2\times10^{-4}$ Pa or less, after which the chamber is filled with sputtering gas until the gas pressure is 0.1 Pa to 1 Pa, or preferably 0.2 Pa to 0.8 Pa, or even more preferably 0.2 Pa to 0.5 Pa. The sputtering gas used is preferably a mixed gas comprising an inert gas and oxygen, and particularly argon and oxygen. After that, the distance between the target and the substrate is adjusted to 10 nm to 100 mm, and preferably 40 nm to 70 mm, and furthermore, direct-current power is applied so that direct-current power with respect to the surface area of the target, or in other words, the direct-current power density is within the range of 1 $W/cm^2$ to 3 $W/cm^2$, which generates direct-current plasma, and after pre-sputtering has been performed for 5 to 30 minutes, the substrate position is corrected as necessary, and preferably sputtering is performed under the same condition.

(b) Crystallization

As the method for crystallizing the oxide semiconductor thin film of the present invention, there is a method of forming a crystalline oxide semiconductor thin film by heating the substrate during film formation to a temperature equal to or greater than the crystallization temperature of the oxide semiconductor thin film, or there is a method of forming an amorphous film by controlling the substrate temperature to a comparatively low temperature range from room temperature to about 100° C., and then annealing and crystallizing the amorphous film at a temperature equal to or greater than the crystallization temperature. In the present invention, it is possible to use either method, however, when crystallization is performed during film formation, the elimination of oxygen deficiencies does not advance even though an annealing process is performed after that, and as a result, it may be difficult to control the carrier density to $1\times10^{19}$ $cm^{-3}$ or less. Therefore in the present invention, preferably an amorphous film is formed and then crystallization is performed by annealing the amorphous film. In the present invention, when employing either method, it is possible to make the heating temperature in the annealing process 400° C. or less.

In the case in which crystallization is performed by forming an amorphous film, and then heat treating the amorphous film by an annealing process using an annealing furnace for example, it is necessary that the heating temperature be 250° C. or greater, and preferably 300° C. or greater, and even more preferably 350° C. or greater. In the present invention, the titanium content is controlled within the range of 0.005 to 0.12 by the Ti/In atomic ratio, and in this case, the crystallization temperature of the oxide semiconductor thin film becomes about 220° C. Therefore, when the heating temperature is less than 250° C., it is not possible to sufficiently crystallize the amorphous oxide semiconductor thin film. When the heating temperature exceeds 450° C., the carrier mobility may decrease extremely, and that tendency begins to appear when the heating temperature exceeds 400° C. Therefore, from the aspect of obtaining an oxide semiconductor thin film having stable and high carrier mobility, preferably the heating temperature is 400° C. or less. In the annealing process, in addition to using an annealing furnace, it is possible to use known means for an annealing process, and to apply annealing conditions, including the heating temperature, according to the respective means.

The processing time is preferably 1 minute to 120 minutes, and more preferably 5 minutes to 60 minutes. When the processing time is less than 1 minute, it is not possible to sufficiently crystallize the obtained oxide semiconductor thin film. On the other hand, when the processing time exceeds 120 minutes, no further effect can be expected, and productivity worsens.

Moreover, the atmosphere of the annealing process is not limited, however, normally annealing is performed in an air atmosphere. When the objective is to reduce the carrier density in addition to performing crystallization, an atmosphere that includes oxygen is preferred, and the density of oxygen is preferably 20% by volume or greater.

As described above, JP 2010-251604 (A) discloses technology of forming a film such as a channel layer by a unheated sputtering method, and then by performing an annealing process in an air atmosphere for 10 minutes to 120 minutes at 150° C. to 300° C., excess deficiencies are reduced in the amorphous film while maintaining the amorphous characteristic. Moreover, in the examples, an annealing process was performed for 30 minutes in an air atmosphere at 150° C. on the In—W—Zn—O film, where the tungsten (W) content is 1 wt % to 10 wt %, that was formed without heating. In other words, the technology disclosed in JP 2010-251604 (A) is technology that makes it possible to maintain an amorphous characteristic of oxide semiconductor thin film in an annealing processing in the temperature range above by adding and dissolving suitable amounts of elements into the $In_2O_3$ phase that are capable of increasing the crystallization temperature, and in that aspect, differs from the present invention.

(c) Fine Processing

The oxide semiconductor thin film of the present invention can undergo fine processing by wet etching or dry etching that is necessary for uses such as TFT or the like. In the case of a method in which first an amorphous film is formed, and after which heat treatment is performed at a temperature equal to or greater than the crystallization temperature, and the oxide semiconductor thin film is crystallized, it is possible to perform processing by wet etching that uses a weak acid after formation of the amorphous film. When doing this, as long as the acid is a weak acid, most any acid can be used, however, preferably the weak acid has oxalic acid as the main component. For example, it is possible to use transparent conductive film etching fluid (ITO-06N) manufactured by Kanto Chemical Co., Ltd. On the other hand, it is also possible to perform dry etching using a suitable etching gas on an oxide thin film after crystallization, or on a crystalline oxide thin film that is formed by heating the substrate to a temperature equal to or greater than the crystallization temperature.

3. TFT Element

The thin film transistor (TFT) of the present invention, as described above, is characterized by using an oxide semiconductor thin film that comprises an oxide that includes indium and titanium. The structure of the TFT of the present invention is not particularly limited. For example, in addition to the bottom-gate top-contact type illustrated in the example in FIG. 1, it is also possible to select other shapes such as bottom-gate bottom-contact type, top-gate bottom-contact type, or top-gate top-contact type.

The TFT element illustrated in FIG. 1 comprises the oxide semiconductor thin film of the present invention, and Au/Ti layered electrodes on a $SiO_2/Si$ substrate that has a $SiO_2$ film that was formed on the surface by thermal oxidation. In this construction, the gate electrode 1 is a Si substrate, the gate insulating layer 2 is a $SiO_2$ film, the channel layer 3 is the oxide semiconductor thin film of the present invention, and the source electrode 4 and drain electrode 5 are Au/Ti layered electrodes.

In the TFT element in FIG. 1, a $SiO_2/Si$ substrate was used, however, the substrate is not limited to this, and it is also possible to use a substrate that has been used as the substrate for electronic devices including thin-film transistors. For example, in addition to a $SiO_2/Si$ substrate or Si substrate, it is also possible to use a glass substrate such as non-alkali glass or quartz glass. Moreover, it is also possible to use various kinds of metal substrates or plastic substrates, or a heat-resistant non-transparent polymer substrate such as a polyimide, and the like.

In the TFT element illustrated in FIG. 1, the gate electrode 1 is made using a Si substrate, however, it is also possible to use metal thin film such as Mo, Al, Ta, Ti, Au, Pt and the like, thin film that is a conductive oxide, nitride or oxide nitride of these metals, or various kinds of conductive high polymer materials. In the case of a transparent TFT, it is possible to use a transparent conductive film such as indium tin oxide (ITO). It is also possible to use an oxide semiconductor thin film that has the same composition as the oxide semiconductor thin film of the present invention as a transparent conductive film. In any case, there is a need for this gate electrode 1 to have good electrical conductivity. More specifically, the specific resistance of these electrodes is preferably controlled to be within the range of $1\times10^{-6}$ Ω·cm to $1\times10^{-1}$ Ω·cm, and more preferably controlled to be within the range of $1\times10^{-6}$ Ω·cm to $1\times10^{-3}$ Ω·cm.

As gate insulating layer 2, it is possible to use a known material such as a metal oxide thin film such as $SiO_2$, $Y_2O_3$, $Ta_2O_5$, Hf oxide and the like, a metal nitride film such as $SiN_y$, or insulating high polymer material such as a polyimide. The specific resistance of the gate insulating layer 2 is preferably controlled to be within the range of $1\times10^6$ Ω·cm to $1\times10^{15}$ Ω·cm, and more preferably $1\times10^{10}$ Ω·cm to $1\times10^{15}$ Ω·cm.

The specific resistance of the channel layer 3 is not particularly limited, however, preferably is controlled to be within the range of $1\times10^{-1}$ Ω·cm to $1\times10^6$ Ω·cm, and more preferably is controlled to be $1\times10^0$ Ω·cm to $1\times10^3$ Ω·cm. In the oxide semiconductor thin film of the present invention, the amount of oxygen deficiencies generated can be adjusted by selecting film formation conditions for the sputtering method or ion plating method, and by selecting conditions for the crystallization annealing process. Therefore, the specified resistance of the range above can be achieved relatively easily.

As in the case of the gate electrode 1, as the source electrode 4 and drain electrode 5, it is possible to use thin film of metals such as Mo, Al, Ta, Ti, Au, Pt and the like, conductive oxide or nitride thin film of those metals, or various kinds of conductive high polymers, or transparent conductive film such as ITO for a transparent TFT. Moreover, these thin films can be layered. The source electrode 4 and drain electrode 5 need to have good electrical conductivity. More specifically, the specific resistance of these electrodes is preferably controlled to be within the range of $10^{-6}$ Ω·cm to $10^{-1}$ Ω·cm, and more preferably controlled to be within the range $10^{-6}$ Ω·cm to $10^{-3}$ Ω·cm.

4. Production Method for TFT Element

The production method for a TFT element of the present invention will be explained in detail. An example of a method of performing an annealing process after low-temperature film formation when forming an oxide semiconductor film will be explained, however, the TFT element of the present invention can also be produced by applying a high-temperature film formation method, and can also be produced by suitably combining other known methods.

First, a $SiO_2$ film is formed by thermal oxidation on the surface of a highly doped n-type Si wafer, to form a $SiO_2$/Si substrate. An amorphous oxide semiconductor thin film having a specified film thickness is formed by a direct-current magnetron sputtering method on the $SiO_2$ film of the substrate, while keeping the substrate at 100° C. or less. The film formation conditions when doing this are the same as the conditions explained in "2. Production Method for Oxide Semiconductor Thin Film", so an explanation here is omitted. A method of etching using photolithography technology after forming an oxide semiconductor thin film as described above can be used as a method for forming an oxide semiconductor thin film having a desired channel length and/or channel width. Alternatively, it is also possible to employ a method of performing film formation after masking when forming an oxide semiconductor thin film.

Next, by performing an annealing process on this oxide semiconductor thin film, the amorphous thin film is formed into a crystalline oxide semiconductor thin film. The conditions for this annealing process are the same as the conditions explained in "2. Production Method for Oxide Semiconductor Thin Film", so an explanation here is omitted.

After that, masking is performed on the obtained crystalline oxide semiconductor thin film (channel layer), after which a Ti thin film having a film thickness of 5 nm, and an Au thin film having a film thickness of 100 nm are sequentially layered, and then by forming a source electrode and a drain electrode, the TFT element of the present invention can be obtained. The formation of the source electrode and drain electrode, as in the formation of the channel layer, can be performed by employing a method of etching using photolithography technology after formation of the Ti thin film and Au thin film.

EXAMPLES

In the following, the present invention will be explained in further detail using examples, however, the present invention is not limited to these examples. The oxide sintered compact, oxide semiconductor thin film and TFT element are evaluated by the methods described below.

[Evaluation of Oxide Sintered Compact]

Powder X-ray diffraction was performed on end materials of the oxide sintered compacts that were obtained in each of the examples and comparison examples using an X-ray diffractometer (X'PertPRO MPD, manufactured by Philips), and the generated phases were identified.

[Fundamental Characteristic Evaluation of Oxide Semiconductor Thin Film]

The composition of the oxide sintered compacts that were obtained in each of the examples and comparison examples was measured using ICP-atomic emission spectrometry. Moreover, the film thickness of the oxide semiconductor thin film was measured using a surface shape measuring apparatus (manufactured by KLA-Tencor Corp.), and the speed of film formation was calculated from the results and film formation time. Furthermore, the carrier density and specific resistance of the oxide semiconductor thin film were measured using a Hall effect measurement apparatus (manufactured by Toyo Corp.), and the carrier mobility was calculated from these values. The identification of the generated phases of the oxide semiconductor thin film was performed in the same way as described above using X-ray diffraction measurement.

[Characteristic Evaluation of TFT Element]

Characteristic evaluation of the TFT element was performed by using a semiconductor parameter analyzer (4200SCS, manufactured by Keithley Instruments) to confirm the TFT element operation and to measure the on/off ratio and the electron field-effect mobility. Here, the on/off ratio is the ratio of the resistance in the off state with respect to that in the on state.

Example 1

An oxide sintered compact (oxide sintered compact target) that comprises indium oxide ($In_2O_3$) that includes titanium was prepared as the sputtering target. This oxide sintered compact was such that the titanium content was 0.018 by a Ti/In atomic ratio, and comprised only the $In_2O_3$ phase.

This oxide sintered compact target was attached to a cathode for a non-magnetic target of a direct-current magnetron sputtering apparatus (manufactured by Canon Tokki Co., Ltd.) that had no generation arcing suppression function. A non-alkali glass substrate (Corning #7059, manufactured by Corning Incorporated) was used for the substrate, and the distance between the target and the substrate was set to be 60 mm. After that, air inside the chamber was evacuated to $2 \times 10^{-4}$ Pa or less, after which a gas mixture comprising Ar and $O_2$ was introduced until the percentage of oxygen was 6.0%, and the gas pressure was adjusted to be 0.6 Pa.

Under these conditions, an oxide semiconductor thin film was formed by applying direct-current power of 300 W (1.64 W/cm$^2$) and generating direct-current plasma. More specifically, after performing pre-sputtering for 10 minutes, a substrate was placed in a stationary position facing the sputtering target, and sputtering was further performed without heating to form a 50 nm thick oxide semiconductor thin film. As the result of measurement using ICP atomic emission spectroscopy, the composition of the obtained oxide semiconductor thin film was confirmed to be mostly the same as the composition of the oxide sintered compact target. Moreover, as a result of X-ray diffraction measurement, it was confirmed that this oxide semiconductor thin film was amorphous.

Next, this oxide semiconductor thin film was annealed for 30 minutes in an air atmosphere at 300° C. As a result of X-ray diffraction measurement, the oxide semiconductor thin film after the annealing process was confirmed to be crystallized, and with $In_2O_3$ (222) as the main peak, this oxide semiconductor thin film was confirmed to practically comprise the $In_2O_3$ phase of bixbyite type structure. Moreover, the average crystal grain size was calculated from the $In_2O_3$ (222) peak and found to be 50 nm.

Finally, Hall effect measurement of the oxide semiconductor thin film was performed, and the carrier density was found to be $3.0 \times 10^{17}$ cm$^{-3}$, and the carrier mobility was found to be 12.3 cm$^2$/Vsec.

Example 2

An amorphous oxide semiconductor thin film was obtained in the same way as in example 1, and an annealing process was performed for 30 minutes in an air atmosphere at 400° C. As a result of X-ray diffraction measurement, the oxide semiconductor thin film after the annealing process was confirmed to be crystallized, and with $In_2O_3$ (222) as the main peak, this oxide semiconductor thin film was confirmed to practically comprise the $In_2O_3$ phase of bixbyite type structure. Moreover, the average crystal grain size was calculated from the $In_2O_3$ (222) peak and found to be 59 nm. Furthermore, Hall effect measurement of the oxide semiconductor thin film was performed, and the carrier density was found to be $3.0 \times 10^{17}$ cm$^{-3}$, and the carrier mobility was found to be 12.3 cm$^2$/Vsec.

Example 3

Except for the titanium content in the oxide sintered compact being 0.01 by the Ti/In atomic ratio, an oxide semiconductor thin film was formed in the same way as in Example 1. As the result of measurement using ICP atomic emission spectroscopy, the composition of the obtained oxide semiconductor thin film was confirmed to be mostly the same as the composition of the oxide sintered compact target. Moreover, as a result of X-ray diffraction measurement, it was confirmed that this oxide semiconductor thin film was amorphous.

Next an annealing process was performed on this oxide semiconductor thin film under the same conditions as in Example 1. As a result of X-ray diffraction measurement, the oxide semiconductor thin film after the annealing process was confirmed to be crystallized, and with $In_2O_3$ (222) as the main peak, this oxide semiconductor thin film was confirmed to practically comprise the $In_2O_3$ phase of bixbyite type structure. Moreover, the average crystal grain size was calculated from the $In_2O_3$ (222) peak and found to be 58 nm. Furthermore, Hall effect measurement of the oxide semiconductor thin film was performed, and the carrier density was found to be $4.8 \times 10^{17}$ cm$^{-3}$, and the carrier mobility was found to be 10.7 cm$^2$/Vsec.

Example 4

Except for the titanium content in the oxide sintered compact target being 0.06 by the Ti/In atomic ratio, an oxide semiconductor thin film was formed in the same way as in Example 1. As the result of measurement using ICP atomic emission spectroscopy, the composition of the obtained oxide semiconductor thin film was confirmed to be mostly the same as the composition of the oxide sintered compact. Moreover, as a result of X-ray diffraction measurement, it was confirmed that this oxide semiconductor thin film was amorphous.

Next an annealing process was performed on this oxide semiconductor thin film under the same conditions as in Example 1. As a result of X-ray diffraction measurement, the oxide semiconductor thin film after the annealing process was confirmed to be crystallized, and with $In_2O_3$ (222) as the main peak, this oxide semiconductor thin film was confirmed to practically comprise the $In_2O_3$ phase of bixbyite type structure. Moreover, the average crystal grain size was calculated from the $In_2O_3$ (222) peak and found to be 55 nm. Furthermore, Hall effect measurement of the oxide semiconductor thin film was performed, and the carrier density was found to be $4.5 \times 10^{17}$ cm$^{-3}$, and the carrier mobility was found to be 10.2 cm$^2$/Vsec.

Example 5

Except for the titanium content in the oxide sintered compact target being 0.09 by the Ti/In atomic ratio, an oxide semiconductor thin film was formed in the same way as in Example 1. As the result of measurement using ICP atomic emission spectroscopy, the composition of the obtained oxide semiconductor thin film was confirmed to be mostly the same as the composition of the oxide sintered compact. Moreover, as a result of X-ray diffraction measurement, it was confirmed that this oxide semiconductor thin film was amorphous.

Next an annealing process was performed on this oxide semiconductor thin film under the same conditions as in Example 1. As a result of X-ray diffraction measurement, the oxide semiconductor thin film after the annealing process was confirmed to be crystallized, and with $In_2O_3$ (222) as the main peak, this oxide semiconductor thin film was confirmed to practically comprise the $In_2O_3$ phase of bixbyite type structure. Moreover, the average crystal grain size was calculated from the $In_2O_3$ (222) peak and found to be 55 nm. Furthermore, Hall effect measurement of the oxide semiconductor thin film was performed, and the carrier density was found to be $4.7 \times 10^{17}$ cm$^{-3}$, and the carrier mobility was found to be 5.2 cm$^2$/Vsec.

Example 6

An amorphous oxide semiconductor thin film was obtained in the same way as in Example 5, and an annealing process was performed for 30 minutes in an air atmosphere at 400° C. As a result of X-ray diffraction measurement, the oxide semiconductor thin film after the annealing process was confirmed to be crystallized, and with $In_2O_3$ (222) as the main peak, this oxide semiconductor thin film was confirmed to practically comprise the $In_2O_3$ phase of bixbyite type structure. Moreover, the average crystal grain size was calculated from the $In_2O_3$ (222) peak and found to be 58 nm. Furthermore, Hall effect measurement of the oxide semiconductor thin film was performed, and the carrier density was found to be $3.9 \times 10^{17}$ cm$^{-3}$, and the carrier mobility was found to be 6.0 cm$^2$/Vsec.

Example 7

Except for the titanium content in the oxide sintered compact target being 0.005 by the Ti/In atomic ratio, an oxide semiconductor thin film was formed in the same way as in Example 1. As the result of measurement using ICP atomic emission spectroscopy, the composition of the obtained oxide semiconductor thin film was confirmed to be mostly the same as the composition of the oxide sintered compact. Moreover, as a result of X-ray diffraction measurement, it was confirmed that this oxide semiconductor thin film was amorphous.

Next, an annealing process was performed on this oxide semiconductor thin film under the same conditions as in Example 1. As a result of X-ray diffraction measurement, the oxide semiconductor thin film after the annealing process was confirmed to be crystallized, and with $In_2O_3$ (222) as the main peak, this oxide semiconductor thin film was confirmed to practically comprise the $In_2O_3$ phase of bixbyite type structure. Moreover, the average crystal grain size was calculated from the $In_2O_3$ (222) peak and found to be 53 nm. Furthermore, Hall effect measurement of the oxide semiconductor thin film was performed, and the carrier density was found to be $8.2 \times 10^{17}$ cm$^{-3}$, and the carrier mobility was found to be 8.8 cm$^2$/Vsec.

Example 8

Except for the titanium content in the oxide sintered compact target being 0.12 by the Ti/In atomic ratio, an oxide semiconductor thin film was formed in the same way as in Example 1. As the result of measurement using ICP atomic emission spectroscopy, the composition of the obtained oxide semiconductor thin film was confirmed to be mostly the same as the composition of the oxide sintered compact. Moreover, as a result of X-ray diffraction measurement, it was confirmed that this oxide semiconductor thin film was amorphous.

Next an annealing process was performed on this oxide semiconductor thin film under the same conditions as in Example 1. As a result of X-ray diffraction measurement, the oxide semiconductor thin film after the annealing process was confirmed to be crystallized, and with $In_2O_3$ (222) as the main peak, this oxide semiconductor thin film was confirmed to practically comprise the $In_2O_3$ phase of bixbyite type structure. Moreover, the average crystal grain size was calculated from the $In_2O_3$ (222) peak and found to be 54 nm. Furthermore, Hall effect measurement of the oxide semiconductor thin film was performed, and the carrier density was found to be $4.3 \times 10^{17}$ cm$^{-3}$, and the carrier mobility was found to be 3.0 cm$^2$/Vsec.

Example 9

Except for the film thickness being 15 nm, an oxide semiconductor thin film was formed in the same way as in Example 1. As the result of measurement using ICP atomic emission spectroscopy, the composition of the obtained oxide semiconductor thin film was confirmed to be mostly the same as the composition of the oxide sintered compact. Moreover, as a result of X-ray diffraction measurement, it was confirmed that this oxide semiconductor thin film was amorphous.

Next an annealing process was performed on this oxide semiconductor thin film under the same conditions as in Example 1. As a result of X-ray diffraction measurement, the oxide semiconductor thin film after the annealing process was confirmed to be crystallized, and with $In_2O_3$ (222) as the main peak, this oxide semiconductor thin film was confirmed to practically comprise the $In_2O_3$ phase of bixbyite type structure. Moreover, the average crystal grain size was calculated from the $In_2O_3$ (222) peak and found to be 13 nm. Furthermore, Hall effect measurement of the oxide semiconductor thin film was performed, and the carrier density was found to be $4.4 \times 10^{17}$ cm$^{-3}$, and the carrier mobility was found to be 10.5 cm$^2$/Vsec.

Example 10

Except for the film thickness being 200 nm, an oxide semiconductor thin film was formed in the same way as in Example 1. As the result of measurement using ICP atomic emission spectroscopy, the composition of the obtained oxide semiconductor thin film was confirmed to be mostly the same as the composition of the oxide sintered compact. Moreover, as a result of X-ray diffraction measurement, it was confirmed that this oxide semiconductor thin film was amorphous.

Next an annealing process was performed on this oxide semiconductor thin film under the same conditions as in Example 1. As a result of X-ray diffraction measurement, the oxide semiconductor thin film after the annealing process was confirmed to be crystallized, and with $In_2O_3$ (222) as the main peak, this oxide semiconductor thin film was confirmed to practically comprise the $In_2O_3$ phase of bixbyite type structure. Moreover, the average crystal grain size was calculated from the $In_2O_3$ (222) peak and found to be 71 nm. Furthermore, Hall effect measurement of the oxide semiconductor thin film was performed, and the carrier density was found to be $2.7 \times 10^{17}$ cm$^{-3}$, and the carrier mobility was found to be 12.1 cm$^2$/Vsec.

Comparative Example 1

Except for the titanium content in the oxide sintered compact target being 0.001 by the Ti/In atomic ratio, an oxide semiconductor thin film was formed in the same way as in Example 1. As the result of measurement using ICP atomic emission spectroscopy, the composition of the obtained oxide semiconductor thin film was confirmed to be mostly the same as the composition of the oxide sintered compact. Moreover, as a result of X-ray diffraction measurement, it was confirmed that this oxide semiconductor thin film was amorphous.

Next an annealing process was performed on this oxide semiconductor thin film under the same conditions as in Example 1. As a result of X-ray diffraction measurement, the oxide semiconductor thin film after the annealing process was confirmed to be crystallized, and with $In_2O_3$ (222) as the main peak, this oxide semiconductor thin film was confirmed to practically comprise the $In_2O_3$ phase of bixbyite type structure. Moreover, the average crystal grain size was calculated from the $In_2O_3$ (222) peak and found to be 55 nm. Furthermore, Hall effect measurement of the oxide semiconductor thin film was performed, and the carrier density was found to be $1.5 \times 10^{19}$ cm$^{-3}$, and the carrier mobility was found to be 9.6 cm$^2$/Vsec.

Comparative Example 2

Except for the titanium content in the oxide sintered compact target being 0.15 by the Ti/In atomic ratio, an oxide semiconductor thin film was formed in the same way as in Example 1. As the result of measurement using ICP atomic emission spectroscopy, the composition of the obtained oxide semiconductor thin film was confirmed to be mostly the same as the composition of the oxide sintered compact. Moreover, as a result of X-ray diffraction measurement, it was confirmed that this oxide semiconductor thin film was amorphous.

Next an annealing process was performed on this oxide semiconductor thin film under the same conditions as in Example 1. As a result of X-ray diffraction measurement, the oxide semiconductor thin film after the annealing process was confirmed to be crystallized, and with $In_2O_3$ (222) as the main peak, this oxide semiconductor thin film was confirmed to practically comprise the $In_2O_3$ phase of bixbyite type structure. Moreover, the average crystal grain size was calculated from the $In_2O_3$ (222) peak and found to be 50 nm. Furthermore, Hall effect measurement of the oxide semiconductor thin film was performed, and the carrier density was found to be $1.3 \times 10^{19}$ cm$^{-3}$, and the carrier mobility was found to be 0.84 cm$^2$/Vsec.

Comparative Example 3

An amorphous oxide semiconductor thin film was obtained in the same way as in Example 1, and an annealing process was performed for 30 minutes in an air atmosphere at 300° C. As a result of X-ray diffraction measurement, it was confirmed that the oxide semiconductor thin film was not crystallized, and it was confirmed that there was no $In_2O_3$ (222) peak in any plane orientation. Therefore Hall effect measurement of the oxide thin film was not performed.

Figure 3:
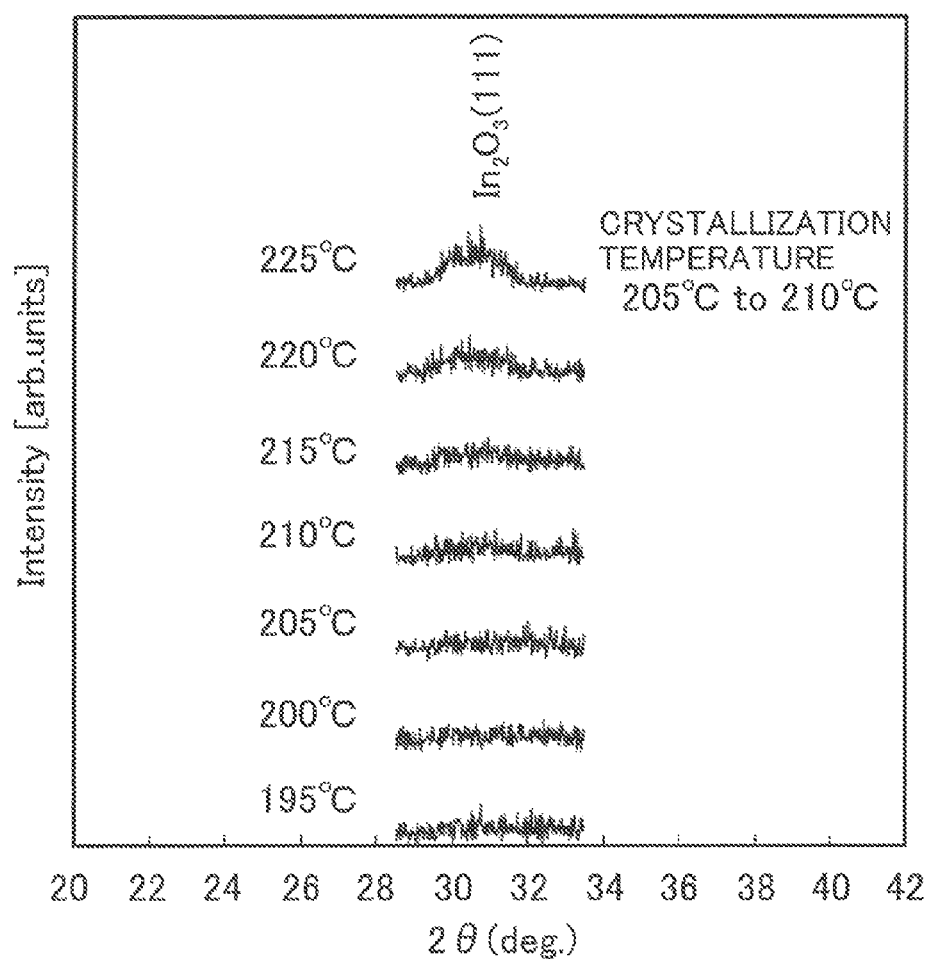
FIG. 3 illustrates the relationship between the heating temperature during an annealing process and the crystallization of the obtained oxide semiconductor thin film.

An amorphous oxide semiconductor thin film that was obtained in the same way as in Example 1 was separately prepared, and high-temperature X-ray diffraction measurement was performed while heating. As a result, the heated temperature range in which it was confirmed that the oxide semiconductor thin film was crystallized was confirmed to be 205° C. to 210° C. (see FIG. 3).

TABLE 1

| | Ti/In | Film thickness (nm) | Annealing temperature (° C.) | Crystallinity | Average crystal grain size (nm) | Carrier density ($\times 10^{18} cm^{-3}$) | Carrier mobility ($cm^2/Vsec$) |
|---|---|---|---|---|---|---|---|
| Ex-1 | 0.018 | 50 | 300 | Crystalline | 50 | 0.30 | 12.3 |
| Ex-2 | 0.018 | 50 | 400 | Crystalline | 59 | 0.50 | 11.6 |
| Ex-3 | 0.01 | 50 | 300 | Crystalline | 58 | 0.48 | 10.7 |
| Ex-4 | 0.06 | 50 | 300 | Crystalline | 55 | 0.45 | 10.2 |
| Ex-5 | 0.09 | 50 | 300 | Crystalline | 55 | 0.47 | 5.2 |
| Ex-6 | 0.09 | 50 | 400 | Crystalline | 58 | 0.39 | 6.0 |
| Ex-7 | 0.005 | 50 | 300 | Crystalline | 53 | 0.82 | 8.8 |
| Ex-8 | 0.12 | 50 | 300 | Crystalline | 54 | 0.43 | 3.0 |
| Ex-9 | 0.018 | 15 | 300 | Crystalline | 13 | 0.44 | 10.5 |
| Ex-10 | 0.018 | 200 | 300 | Crystalline | 71 | 0.27 | 12.1 |
| Cx-1 | 0.001 | 50 | 300 | Crystalline | 55 | 15 | 9.6 |
| Cx-2 | 0.15 | 50 | 300 | Crystalline | 50 | 13 | 0.84 |
| Cx-3 | 0.018 | 50 | 200 | Amorphous | — | — | — |

(Ex = Example, Cx = Camparative Example)

[Evaluation of Oxide Semiconductor Thin Film]

Examples 1 to 10 are examples in which the titanium content was controlled to be within the range of 0.005 to 0.12 by the Ti/In atomic ratio, and an annealing process was performed in an air atmosphere at a temperature of 400° C. or less. Therefore, in all of the Examples 1 to 10, the oxide semiconductor thin film was crystallized, and the average crystal grain size, the carrier density and the carrier mobility were all within the specified ranges of the present invention.

Particularly, in Examples 1 to 4, the titanium content was controlled to be within the range of 0.01 to 0.06 by the Ti/In atomic ratio, and an annealing process was performed in an air atmosphere at 400° C. or less, so excellent carrier characteristics such as a carrier density of $5\times10^{17}$ $cm^{-3}$ or less and a carrier mobility of 10 $cm^2/Vsec$ or greater were confirmed.

In Examples 5 and 6, the titanium content was 0.09, and an annealing process was performed in an air atmosphere at 400° C. or less, so a carrier density of $5\times10^{17}$ $cm^{-3}$ or less and a carrier mobility of 5 $cm^2/Vsec$ or greater were confirmed.

Moreover, Examples 7 and 8 are examples of the lower limit value and upper limit value of the titanium content, and even though the carrier density and carrier mobility are both within the ranges of the present invention, in Example 7, the carrier density, and in Example 8 the carrier mobility were values that were somewhat inferior to the other Examples.

Furthermore, from Examples 9 and 10, it was confirmed that when the titanium content was 0.018 by the Ti/In atomic ratio and the film thickness was 15 nm and 200 nm, crystallization was possible even when the heating temperature in the annealing process was 300° C., and in this case the crystal grain size was 10 nm or greater, the carrier density was $1\times10^{18}$ $cm^{-3}$ or less and a carrier mobility of 5 $cm^2/Vsec$ or greater.

On the other hand, Comparative Example 1 is an example in which the titanium content is less than 0.005 by the Ti/In atomic ratio, or in other words, less than the lower limit, and in this case, it was confirmed that the carrier density was greater than $1\times10^{19}$ $cm^{-3}$.

Comparative Example 2 is an example in which the titanium content was greater than 0.12 by the Ti/In atomic ratio, or in other words, greater than the upper limit, and in this case, it was confirmed that the carrier density was greater than $1\times10^{19}$ $cm^{-3}$, and the carrier mobility was less than 1 $cm^2/Vsec$.

Comparative Example 3 is an example in which the heating temperature in the annealing process was 200° C., and it was not possible to crystallize the amorphous oxide semiconductor thin film.

Example 11

An oxide sintered compact (oxide sintered compact target) comprising indium oxide ($In_2O_3$) that includes titanium was prepared as a sputtering target. This oxide sintered compact had a titanium content of 0.018 by a Ti/In atomic ratio, and comprised only the $In_2O_3$ phase.

This oxide sintered compact target was attached to a non-magnetic target cathode of a direct-current magnetron sputtering device, and an amorphous oxide semiconductor thing film having a film thickness of 50 nm was formed on a $SiO_2$ film on a 300 nm thick Si wafer on which a thermal oxidized $SiO_2$ film was formed. The film formation conditions here were the same as in Example 1.

Next, this oxide semiconductor thin film was crystallized by performing an annealing process for 30 minutes in an air atmosphere at 300° C. As a result, the Si substrate, the $SiO_2$ film and the crystalline oxide semiconductor thin film were taken to be a gate electrode 1, gate insulating layer 2 and a channel layer 3, respectively.

Next, by forming a 5 nm thick Ti layer, and a 100 nm thick Au layer sequentially on the surface of the channel layer 3 by a direct-current magnetron sputtering method, a source electrode 4 and drain electrode 5 constructed by the Au/Ti layered film were formed, and a thin film transistor (TFT element) having construction as illustrated in FIG. 1 was obtained. Except for using only argon gas (Ar) as the sputtering gas, and changing the direct-current power to 50 W, the film formation conditions for the source electrode 4 and drain electrode 5 were the same as the film formation conditions of the oxide semiconductor thin film.

Finally, patterning of the source electrode 4 and drain electrode 5 was performed with a metal mask, and a TFT element having a channel length of 100 µm and a channel width of 450 µm was obtained.

The operating characteristics of the obtained TFT element were examined using a semiconductor parameter analyzer, and as a result operating characteristics as a TFT element could be confirmed. Moreover, this TFT element was confirmed to display good values such as a on/off ratio of 108 or greater, and electron field-effect mobility of 22.5 cm²/Vsec.

EXPLANATION OF REFERENCE NUMBERS

1 Gate electrode
2 Gate insulating layer
3 Channel layer
4 Source electrode
5 Drain electrode

What is claimed is:

1. An oxide semiconductor thin film comprising:
an oxide including indium and titanium,
the oxide semiconductor thin film
having a titanium content of 0.005 to 0.12 by a Ti/In atomic ratio;
being crystalline and comprising only an $In_2O_3$ phase of bixbyite type structure; and
having a carrier density of $1\times10^{19}$ cm$^{-3}$ or less and a carrier mobility of 1 cm²/Vsec or greater.

2. The oxide semiconductor thin film according to claim 1, wherein the titanium content is 0.01 to 0.06 by the Ti/In atomic ratio.

3. The oxide semiconductor thin film according to claim 1, wherein the carrier mobility is 3 cm²/Vsec or greater.

4. The oxide semiconductor thin film according to claim 1, wherein the carrier density is $5\times10^{17}$ cm$^{-3}$ or less and the carrier mobility is 5 cm²/Vsec or greater.

5. The oxide semiconductor thin film according to claim 1 and having a film thickness of 15 nm to 200 nm.

6. The oxide semiconductor thin film according to claim 1, and having a film thickness of 40 nm to 100 nm.

7. The oxide semiconductor thin film according to claim 1, and having a crystal grain size of the $In_2O_3$ phase of 10 nm or greater.

8. A thin film transistor comprising:
a source electrode,
a drain electrode,
a gate electrode,
a channel layer; and
a gate insulating layer,
wherein the channel layer comprises an oxide semiconductor thin film having
an oxide including indium and titanium
the oxide semiconductor thin film
having a titanium content of 0.005 to 0.12 by a Ti/in atomic ratio;
being crystalline and comprising only an $In_2O_3$ phase of bixbyite type structure; and
having a carrier density of $1\times10^{19}$ cm$^{-3}$ or less and a carrier mobility of 1 cm²/Vsec or greater.

9. A method of producing an oxide semiconductor thin film, the method comprising the steps of:
annealing an amorphous oxide semiconductor thin film, the amorphous oxide semiconductor thin film comprising an oxide that includes indium and titanium and having a titanium content of 0.005 to 0.12 by a Ti/In atomic ratio, at a heating temperature of 250° C. or greater and processing time of 1 minute to 120 minutes, to obtain an oxide semiconductor thin film being crystalline and comprising only an $In_2O_3$ phase of bixbyite type structure, and having a carrier density of $1\times10^{19}$ cm$^{-3}$ and a carrier mobility of 1 cm²/Vsec or greater.

* * * * *